United States Patent [19]

Tokushige

[11] Patent Number: 5,777,925
[45] Date of Patent: Jul. 7, 1998

[54] SEMICONDUCTOR NON-VOLATILE MEMORY DEVICE

[75] Inventor: Kaoru Tokushige, Yokohama, Japan

[73] Assignee: Kabushiki Kaisha Toshiba, Tokyo, Japan

[21] Appl. No.: 888,073

[22] Filed: Jul. 3, 1997

[30] Foreign Application Priority Data

Jul. 11, 1996 [JP] Japan .................................. 8-182453

[51] Int. Cl.[6] .................................................. G11C 11/34
[52] U.S. Cl. .................. 365/185.11; 365/185.13; 365/185.17; 365/185.33
[58] Field of Search ...................... 365/185.11, 185.13, 365/185.17, 185.33

[56] References Cited

U.S. PATENT DOCUMENTS 5,717,635   2/1998   Akatsu ..................... 365/185.11

*Primary Examiner*—David C. Nelms
*Assistant Examiner*—Trong Phan
*Attorney, Agent, or Firm*—Loeb & Loeb LLP

[57] ABSTRACT

A semiconductor non-volatile memory device, e.g., flash type E2 PROM capable of electrically carrying out block erasing is provided. This semiconductor device comprises a column decoder supplied with a column address signal to select a bit line, a row decoder supplied with a row address signal to select a word line, at least one NOR type memory cell array, and at least one NAND type memory cell array. In this semiconductor device, the NOR type memory cell array and the NAND type memory cell array are connected to common bit lines, and are connected to different word lines. Thus, both the NOR type and NAND type memory cell arrays are disposed on the same chip to realize one chip configuration so that improvement in the mounting area can be attained.

9 Claims, 6 Drawing Sheets

F I G. I
PRIOR ART

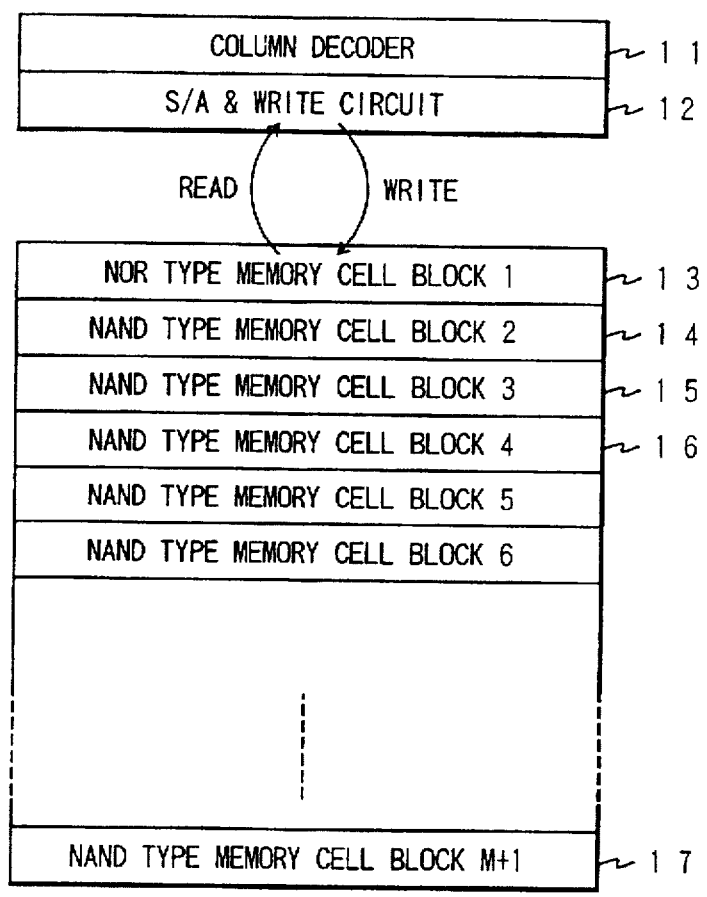
F I G. 2

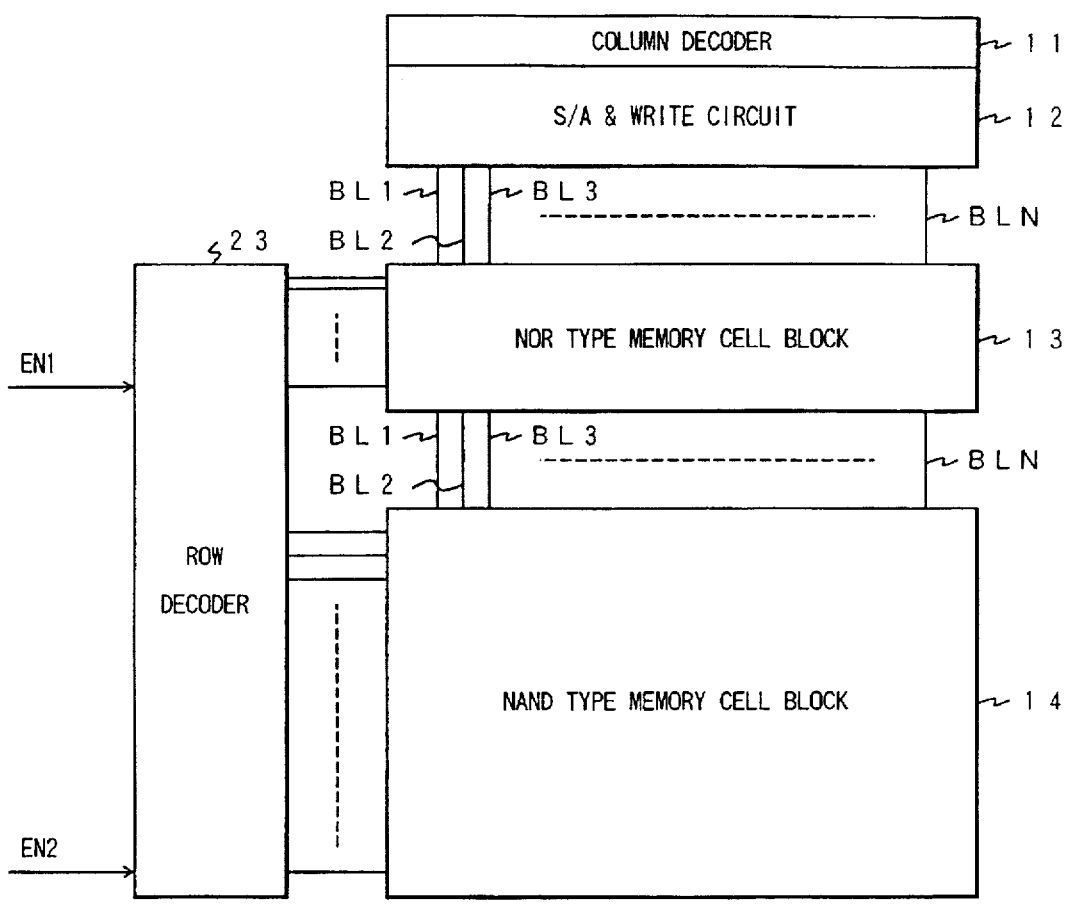
F I G. 5

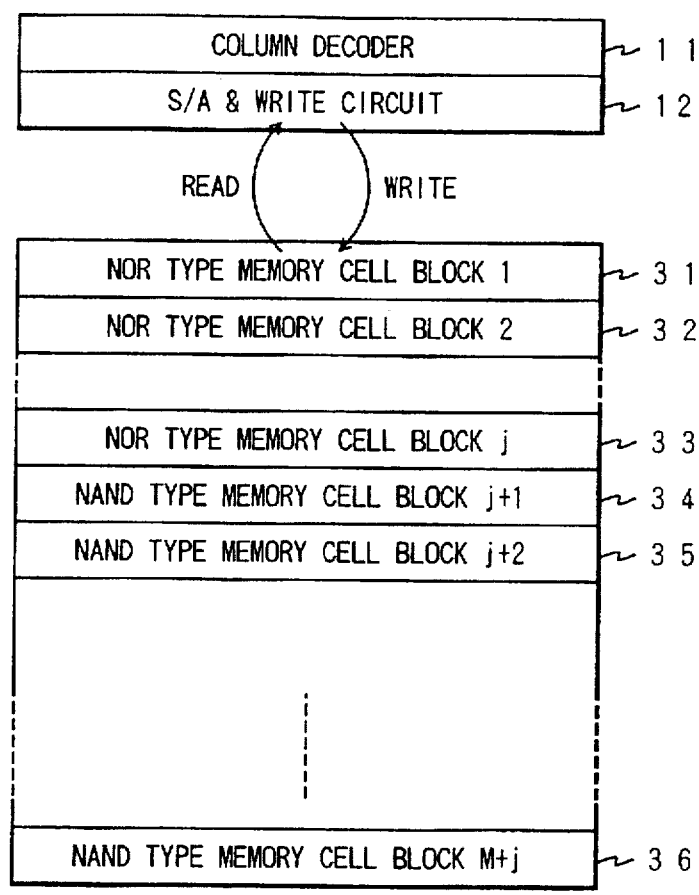
F I G. 6

SEMICONDUCTOR NON-VOLATILE MEMORY DEVICE

BACKGROUND OF THE INVENTION

This invention relates to a semiconductor non-volatile memory device, and more particularly to a flash type E2 PROM (Electrically Erasable & Programmable Read Only Memory) capable of electrically carrying out block erasing.

In the conventional semiconductor non-volatile memory device, particularly a card type memory widely used in portable computer, etc. had a configuration as shown in FIG. 1.

In the card type memory 100, a NOR type E2 PROM 101, a NAND type E2 PROM 102, and peripheral circuit (not shown) are mounted (assembled). The NOR type E2 PROM 101 is adapted so that bit line contacts are provided every respective cells, and memory cells are connected in parallel to one bit line, and includes a NOR type memory cell array for carrying out read/write operation by random access.

On the other hand, the NAND type E2 PROM 102 is adapted so that plural memory cells are connected in series, and includes a NAND type memory cell array in which contacts with bit lines are shared with respect to plural memory cells. Further, in the case of the NAND type E2 PROM 102, data read-out speed when access is provided ar random is lower than that of the NOR type E2 PROM 101, but high integration can be made. In addition, this NAND type E2 PROM 102 is suitable for serially carrying out read or write operation in the bit line direction.

Moreover, as data to be stored into the card type memory 100, there are body of data and attribute data indicating attribute such as name or capacity, etc. of this data. Since the data body 104 has large capacity, it is stored into the NAND type E2 PROM 102 permitted to undergo high integration and is subjected to serial access. On the other hand, the attribute data 103 has small capacity, and is stored into high speed and random accessable NOR type E2 PROM 101.

However, the NOR type E2 PROM 101 and the NAND type E2 PROM 102 were conventionally formed as independent circuits on different chips. For this reason, it was necessary to mount (assemble) E2 PROMs 101 and 102 constituted by two chips in the card type memory 100, thus leading to lowering in the area efficiency.

SUMMARY OF THE INVENTION

Accordingly, an object of this invention is to provide a semiconductor non-volatile memory device in which the NOR type EPROM which carries out random access and the NAND type EPROM which carries out serial access are disposed on the same chip to realize one chip configuration so that improvement in the mounting area can be attained.

A semiconductor non-volatile memory device of this invention comprises a column decoder supplied with a column address signal to select a bit line, a row decoder supplied with a row address signal to select a word line, at least one NOR type memory cell block, and at least one NAND type memory cell block, wherein the NOR type memory cell block and the NAND type memory cell block are connected to common bit lines, and are connected to different word lines.

As stated above, in accordance with this invention, there is employed the configuration that the bit lines are shared with respect to the NOR type memory cell array and the NAND type memory cell array to select any one of memory cell arrays to provide access thereto. As a result, the wiring efficiency is high and implementation of one chip can be carried out. Accordingly, the mounting efficiency is improved as compared to the case where both memory cell arrays are mounted on the different chips.

Here, when data is inputted to the NOR type memory cell block connected to the word line selected by the row decoder, or data which has been read out therefrom is outputted, and when data is inputted to the NAND type memory cell block connected to the word line selected by the row decoder, or data which has been read out therefrom is outputted, data is transferred through the common bit line.

The device of this invention may further comprise a sense amplifier & write circuit which amplifies data transferred through the bit line selected by the column decoder to output it to the external, or transfers data given from the external to the bit line selected by the column decoder. In this case, when data is written into the NOR type memory cell block, or the written data is read out, and when data is written into the NAND type memory cell block, or the written data is read out, data is delivered from the external to the sense amplifier & write circuit through the common bit line, or data is outputted from the sense amplifier & write circuit to the external through the common bit line.

Addresses of the word lines may be continuous between the word lines connected to the NOR type memory cell block and the word lines connected to the NAND type memory cell block. In this case, in the row decoder, the row decoder for NOR type memory cell block for selecting word line connected to the NOR type memory cell block and the row decoder for the NAND type memory cell block for selecting word line connected to the NAND type memory cell block are integrated.

Moreover, addresses of the word lines may be discontinuous between the word lines connected to the NOR type memory cell block and the word lines connected to the NAND type memory cell block. In this case, the row decoder is separated with respect to the row decoder for NOR type memory cell block for selecting the word line connected to the NOR type memory cell block and the row decoder for the NAND type memory cell block for selecting the word line connected to the NAND type memory cell block.

There may be employed a configuration such that the NOR type memory cell block includes NOR type memory cell block select lines and a NOR type memory cell block word line or lines wired in a manner respectively perpendicular to the bit lines, and N number of NOR type memory cell block select transistors and NOR type memory cell transistors arranged respectively in correspondence with the N number of bit lines, wherein the NOR type memory cell block select transistors are caused to undergo ON/OFF control by the NOR type memory cell block select lines, the NOR type memory cell transistors are respectively connected to corresponding ones of the bit lines through corresponding NOR type memory cell block select transistors, and the NOR type memory cell transistors are caused to undergo ON/OFF control by the NOR type memory cell block word line or lines; and the NAND type memory cell block includes NAND type memory cell block select lines and M number of NAND type memory cell block word lines wired in a manner respectively perpendicular to the bit lines, N number of NAND type memory cell block select transistors disposed respectively in correspondence with the N-number of bit lines, and M×N number of NAND type memory cell transistors respectively connected in series by M number of transistors along the bit line direction, wherein the NAND type memory cell block select transistors are caused to undergo ON/OFF control by the NAND type memory cell block select lines, respective M sets of the NAND type memory cell transistors along the bit line direction are connected to corresponding ones of the bit lines through corresponding ones of the NAND type memory cell block transistors, and respective N sets of the NAND type memory cell transistors perpendicular to the bit lines are caused to undergo ON/OFF control by corresponding ones of the NAND type memory cell block word lines.

Further, there may be employed a configuration such that the NOR type memory cell block comprises a first block select line, a NOR type memory cell block word line and a second block select line which are respectively wired in a direction perpendicular to the bit lines, and includes, every the respective bit lines, first block select transistors respectively having gates connected to the first block select line and one ends connected to the bit lines, NOR type memory cell transistors respectively having one ends connected to the other ends of the first block select transistors and gates connected to the NOR type memory cell block word line, and second block select transistors respectively having one ends connected to the other ends of the NOR type memory cell transistors, the other ends grounded and gates connected to the second block select line; and the NAND type memory cell block comprises a third block select line, M number of NAND type memory cell block word lines and a fourth block select line respectively wired in a direction perpendicular to the bit lines, and includes every the respective bit lines, third block select transistors respectively having gates connected to the third block select line and one ends connected to the bit lines, M number of NAND type memory cell transistors respectively having both ends connected in series between the other ends of the third block select transistors and one ends of fourth block select transistors and gates connected to the NAND type memory cell block word lines, and the fourth block select transistors respectively having the one ends connected to one ends of the NAND type memory cell transistors of the final row of the NAND type memory cell transistors, the other ends grounded, and gates connected to the fourth block select line.

In addition, there may be employed a configuration such that the NOR type memory cell block is operative at the time of write operation to make a setting such that the first block select line is at high level and the second block select line is at low level to raise potential on the NOR type memory cell block word line to write data by the sense amplifier & write circuit with respect to the NOR type memory cell transistor through the bit line selected by the column decoder, and is operative at the time of read operation to make a setting such that the first and second block select lines are at high level to raise potential on the NOR type memory cell block word line to read out data by the sense amplifier & write circuit from the NOR type memory cell transistor through the bit line selected by the column decoder; and the NAND type memory cell block is operative at the time of write operation to make a setting such that the first block select line is at high level and the second block select line is at low level, and to make a setting such that selected one of the NAND type memory cell block word lines is at a first potential higher than low level and the other word lines are at a second potential to serially write data by the sense amplifier & write circuit with respect to the NAND type memory cell transistors through the bit lines selected in order by the column decoder, and is operative at the time of read operation to make a setting such that the first and second block select lines are at high level, and to make a setting such that selected one of the NAND type memory cell block word lines is at low level and the other word lines are at high level to serially read out data by the sense amplifier & write circuit from the NAND type memory cell transistors through the bit lines selected in order by the column decoder.

In this case, while setting is made such that the threshold value of the NOR type memory cell block is set in such a manner to set, at the time of read operation, potential on the word line at high level to carry out read-out operation, such a setting may be made to set potential on the word line at low level to carry out read-out operation.

BRIEF DESCRIPTION OF THE DRAWINGS

In the accompanying drawings:

FIG. 2 is a block diagram showing outline of the configuration of a semiconductor non-volatile memory device according to a first embodiment of this invention.

FIG. 5 is a block diagram showing outline of the configuration of a semiconductor non-volatile memory device according to a second embodiment of this invention.

FIG. 6 is a block diagram showing outline of the configuration of a semiconductor non-volatile memory device according to a third embodiment of this invention.

DESCRIPTION OF THE PREFERRED EMBODIMENTS

Figure 1:
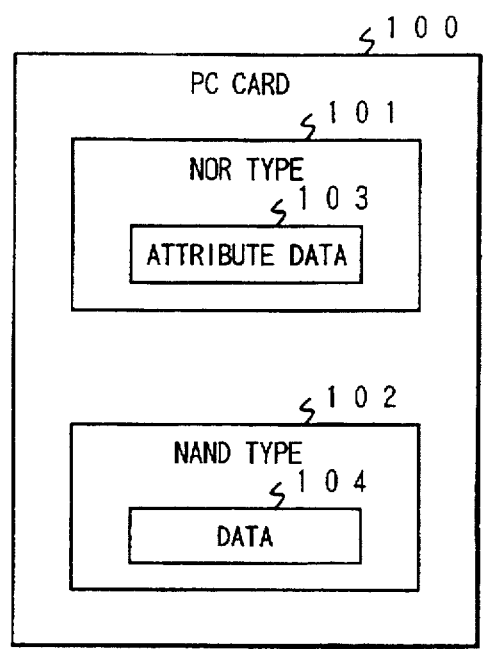
FIG. 1 is a block diagram showing the configuration of a conventional semiconductor non-volatile memory device.

Explanation will now be given with reference to the attached drawings in connection with the semiconductor non-volatile memory device according to respective embodiments of this invention.

This device is adapted so that a NOR type memory cell block and a NAND type memory cell block are arranged along the direction of bit lines and are respectively connected to common bit lines, and the input/output section of the sense amplifier, etc. is shared with respect to the NOR type memory cell block and the NAND type memory cell block. By employing such a configuration, implementation of one chip is realized in the state where the wiring efficiency has been improved. In this case, write or read operation with respect to the memory cell block is carried out by selecting any one of the memory cell blocks.

Initially, outline of the configuration of the semiconductor non-volatile memory device according to the first embodiment of this invention is shown in FIG. 2. A single NOR type memory cell block 1 13 including NOR type memory cell array, and M (M is integer equal to 2 or more) number of NAND type memory cell blocks 2 14~M+1 17 each including NAND type memory cell array are arranged along the bit line direction. Namely, the NOR type memory cell block 1 which has small capacity but is random-accessable at a high speed and the NAND type memory cell blocks 2~M+1 which can be caused to undergo high integration and is caused to undergo serial access are disposed along the bit line direction.

The NOR type memory cell block 1 13 and the NAND type memory cell block 2 14~M+1 17 are respectively connected to the same bit lines (not shown). These bit lines are connected to the sense amplifier & write circuit 12 and the column decoder 11.

As stated above, the NOR type memory cell block 1 13 and the NAND type memory cell blocks 2 14~M+1 17 are connected to the common bit lines. By row decoder (not shown), any one of the memory cell blocks is selected. The memory cell block thus selected is adapted so that data is written thereinto or written data is read out by the sense amplifier & write circuit 12.

Attribute data of small capacity is written into the NOR type memory cell block 1 13. Write or read operation of this NOR type memory cell block 1 13 is carried out by random access. Data body of large capacity is written into the NAND type memory cell block 2 14~M+1 17. Write or read operation of the NAND type memory cell block 2 14~M+1 17 is carried out by serial access.

Figure 3:
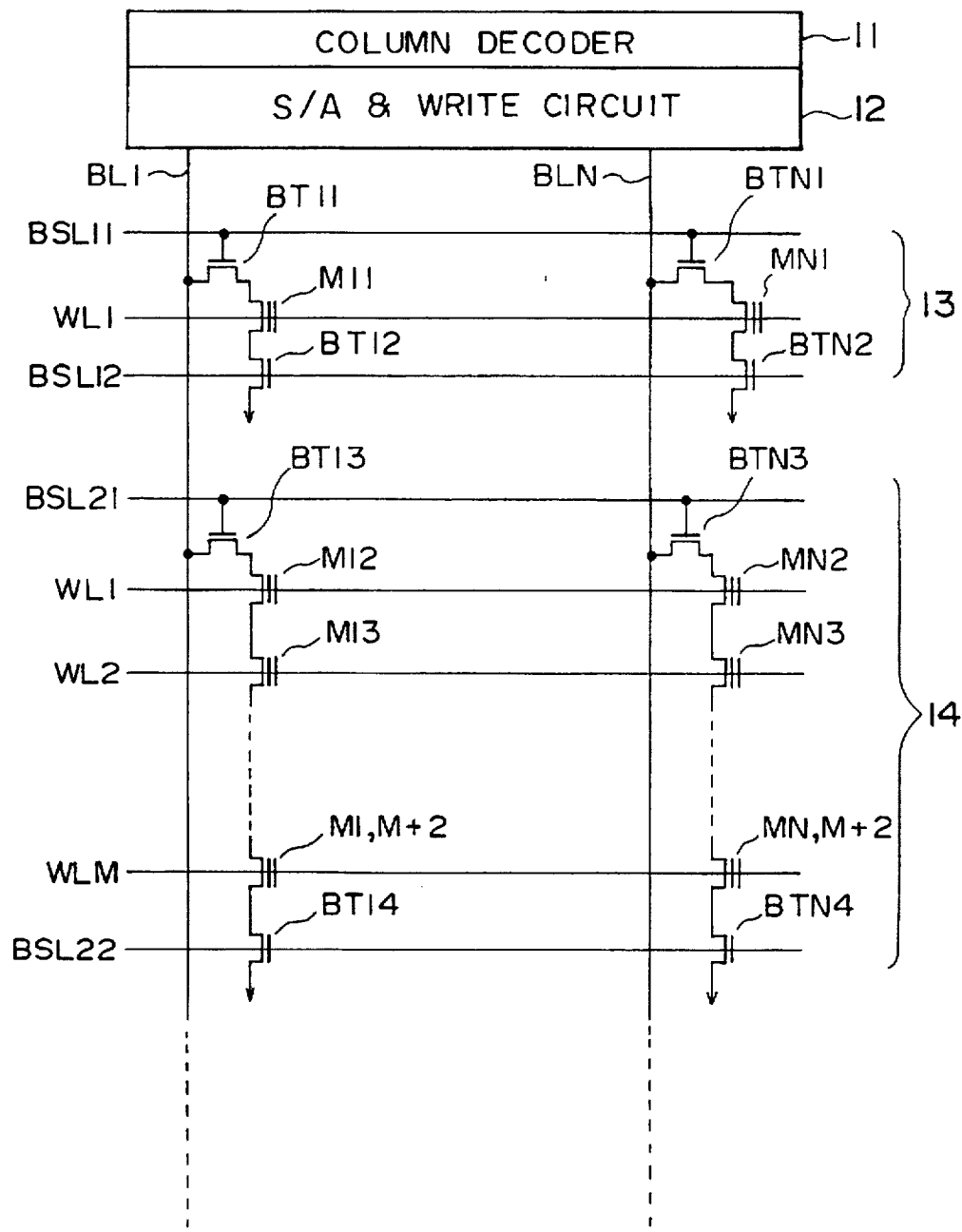
FIG. 3 is a circuit diagram showing the detailed configuration of the semiconductor non-volatile memory device according to the first embodiment.

A more practical circuit configuration of the NOR type memory cell block 1 13 and the NAND type memory cell block 2 14 in the first embodiment shown in FIG. 2 is shown in FIG. 3. N number of bit lines BL1~BLN are connected to the column decoder 11 and the sense amplifier & write circuit 12, and the NOR type memory cell block 1 13 and the NAND type memory cell block 2 14 are disposed along the bit lines BL1~BLN.

With respect to the NOR type memory cell block 1 13, a block select line BSL11, a word line WL1 and a block select line BSL12 are wired in a manner perpendicular to the bit lines BL1~BLN. When the bit line BL1 is taken as an example, drain of a block select transistor BT11 for switching comprised of N-channel type MOS transistor is connected to the bit line BL1, drain of a memory cell transistor M11 having floating gate is connected to source of the transistor BT11, drain of a block select transistor BT12 is connected to source of the transistor M11, and source thereof is grounded. Gate of the transistor BT11 is connected to the block select line BSL11, gate of the transistor M11 is connected to the word line WL1, and gate of the transistor BT12 is connected to the block select line BSL12.

Circuits respectively including block select transistors BTJ1 (J is integer within the range from 1 to N), memory cell transistors MJ1, and block select transistors BTJ2 are similarly provided also at other bit lines BL2~BLN.

On the other hand, with respect to the NAND type memory cell block 14, a block select line BSL21, M number of word lines WL1~WLM and a block select line BSL22 are wired in a manner perpendicular to the bit lines BL1~BLN. In regard to the bit line BL1, drain of a block select transistor BT13 is connected to the bit line BL1, and drains of M number of memory cell transistors M12~M1, M+2 are connected in series between source of the transistor BT13 and the ground terminal.

Gate of the transistor BT13 is connected to the block select line BSL21, gates of the transistors M12~M1, M+2 are respectively connected to word lines WL1~WLM, and gate of a transistor BT14 is connected to the block select line BSL22.

Similarly, also at other bit lines BL2~BLN, circuits respectively including block select transistors BTJ3, memory cell transistors MJ2~MN,M+2, and block select transistors BTJ1 are similarly provided.

In this device as constituted above, write or read operation will be conducted as follows. Initially, when attribute data is written into the NOR type memory cell array, the NOR type memory cell block 13 is selected. The block select line BSL11 is caused to be at high level and the block select line BSL12 is caused to be at low level to raise potential on the word line WL1. As a result, a column address signal is inputted from the external to the column decoder 11. Thus, any one of columns is selected. Data to be written is transferred to the bit line BLJ of the selected column J by the sense amplifier & write circuit 12. Thus, data is written with respect to the memory transistor MJ1 connected to the bit line BLJ.

When read operation is carried out, the block select lines BSL11 the BSL12 are caused to be both at high level, thus leading to the state where the memory cell transistor MJ1 is connected to the bit line BLJ through the block select transistor BT11 for switching. Data written in the memory cell MJ1 connected to this bit line BLJ is read out through the bit line BLJ selected by the column decoder 11, and is amplified by the sense amplifier & write circuit 12. The data thus amplified is outputted to the external.

In this case, ordinarily, the threshold voltage of the transistor MJ1 which is the NOR type memory cell is set as follows. When the word line WL1 is at high level, the transistor MJ1 adapted so that electrons are injected into the floating gate is maintained in OFF state, and the transistor MJ1 adapted so that no electron is injected into the floating gate is turned ON.

On the other hand, in the case of the transistor constituting the NAND type memory cell which will be described later, generally, when the word line WL is at low level, the transistor adapted so that electrons are injected into the floating gate is turned OFF, and the transistor adapted so that no electrons is injected into the floating gate is turned ON.

In view of the above, the threshold voltage of the transistor MJ1 constituting the NOR type memory cell may be also set similarly to the NAND type memory cell. Namely, the threshold value of the transistor MJ1 can be set so that when the word line WL1 is at low level, the transistor MJ1 adapted so that electrons are injected into the floating gate is maintained in OFF state, and the transistor MJ1 adapted so that no electron is injected into the floating gate is turned ON.

When the data body is written into the NAND type memory cell block, any one of the NAND type memory cell blocks is selected. When, e.g., block 14 is selected, setting is made such that the block select line BSL21 is at high level and the block select line BSL22 is at low level. With respect to the word lines WL1~WLM, high voltage, e.g., 20 volts is applied to the word line to which memory cell M into which data is to be written is connected, and voltage, e.g., about 7 volts is applied to other word lines WL. Data is transferred through the bit line BL to which the memory cell M into which data is to be written is connected by the column decoder. Thus, the data is written into the memory cell M. The column decoder 11 is used to successively shift selection of bit line to BL1~BLN to transfer data, thereby making it possible to sequentially and serially write data into N number of memory cells M connected to the same word line WL.

When data written in the NAND type memory cell array is serially read out, the block select lines BL21 and BL22 of the selected block 14 are caused to be both at high level. With respect to the word lines, the word line to which the memory cell from which data is to be read out is connected is caused to be zero volts, and other word lines WL are caused to be high level, such as, for example, 5 volts. Columns are successively selected in order of 1~N by the column decoder 11, and data of the memory cell M from which data is to be read out are transferred through bit lines BL1~BLN. Thus, such data are serially read out from the sense amplifier & write circuit 12.

As stated above, in accordance with this embodiment, there is employed the configuration in which the small capacity and high speed random accessable NOR type memory cell array and large capacity and serially accessable NAND type memory array are caused to be shared with respect to the bit lines and the input/output section to select either one of memory cell arrays to provide access thereto, thereby making it possible to realize one chip configuration in the state where the wiring efficiency is enhanced. Thus, as compared to the prior art in which the NOR type memory cell array and the NAND type memory cell array are respectively mounted (assembled) on different chips, the mounting efficiency can be improved.

Figure 4:
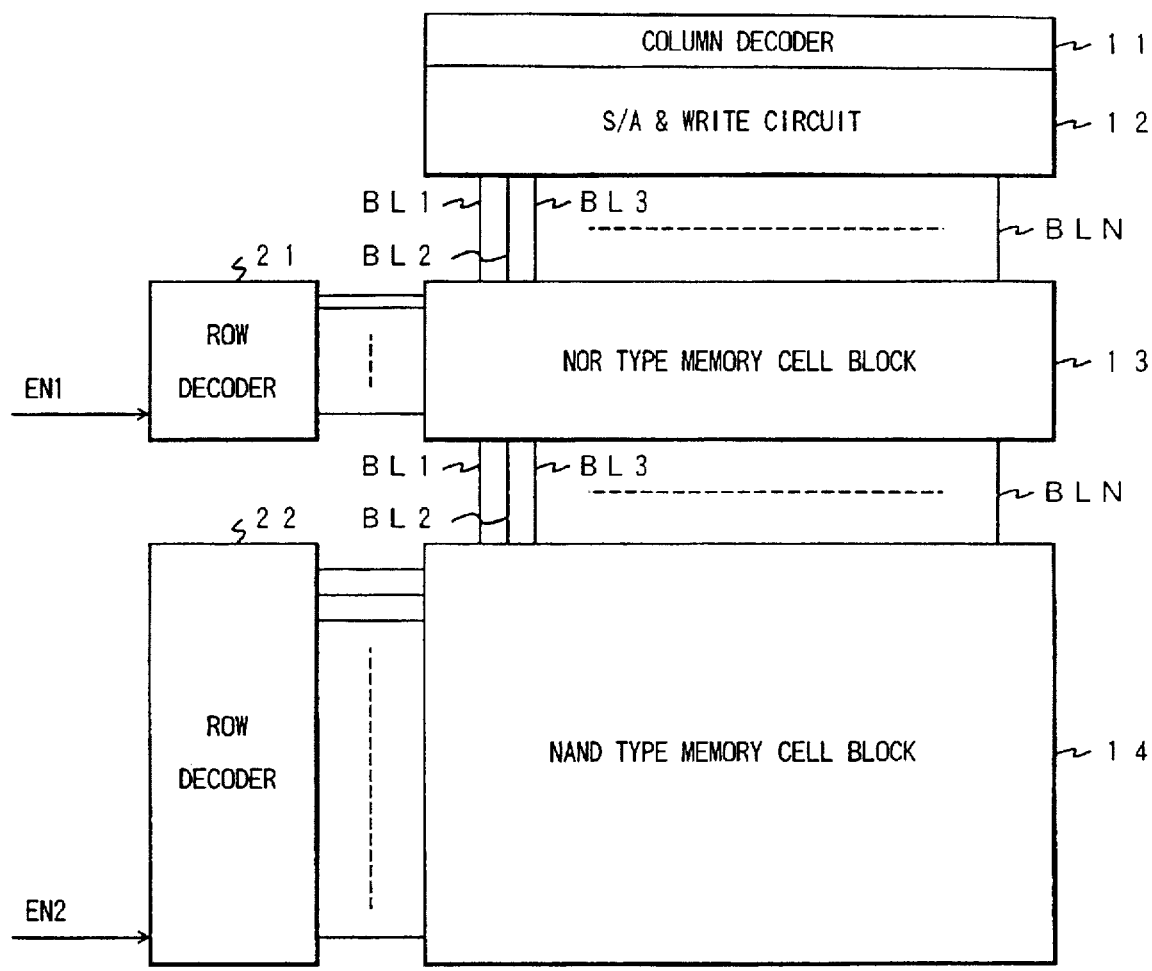
FIG. 4 is a block diagram showing outline of the configuration of the semiconductor non-volatile memory device according to the first embodiment.

In this case, in the first embodiment which has been described with reference to FIGS. 2 and 3, setting is made such that the address of the word line WL1 of the NOR type memory cell block 1 13 and the addresses of respective word lines WL1, WL2, . . . , WLM of the NAND type memory cell blocks 2 14, 3 15, 4 16, . . . , M+1 17 are caused to be discontinuous. The arrangement state of the row decoder 21 for selecting word line of the NOR type memory cell block 1 13 and the row decoder 22 for selecting word line of the NAND type memory cell block 2 14 in this case is shown in FIG. 4.

The row decoder 21 for NOR type memory cell block is supplied with row address signal and enable signal EN1 from the external. Similarly, the row decoder 22 for NAND type memory cell block is supplied with row address signal and enable signal EN2 from the external.

At the time of providing access to the NOR type memory cell block 13, the row decoder 21 is caused to become active by the enable signal EN1 so that there results the operative state. As a result, the row address signal is inputted to the decoder 21. Thus, the block select lines BSL11 and BSL12 and the word line WL1 connected to the row decoder 21 are caused to be respectively at levels necessary for access as described above. On the other hand, before, simultaneously with or after selection of the word line WL1, any one of the bit lines BL1~BLN is selected by the column decoder 11. Thus, selected any one NOR type memory cell is accessed.

At the time of providing access to the NAND type memory cell block 14, the row decoder 22 is caused to become active by the enable signal EN2 so that there results the operative state. As a result, the row address signal is inputted to the row decoder 22. Thus, word line selected by the row address signal of the word lines WL1~WLM is caused to be at level necessary for access. Similarly, the block select lines BSL21 and BSL22 connected to the row decoder 22 are caused to be at level necessary for access. As a result, the selected NAND type memory cell is accessed. Similarly to the case where the NOR type memory cell block is accessed, before, simultaneously with or after selection of the word lines WL1~WLM, any one of the bit lines BL1~BLN is selected by the column decoder 11. Thus, the selected NAND type memory cell is accessed.

In the device according to the second embodiment of this invention, as shown in FIG. 5, the row decoder for NOR type memory cell block 13 and the row decoder for NAND type memory cell block 14 are integrated as one row decoder 23. In this case, row addresses of the word lines WL are continuous, staring from the word line WL1 of the NOR type memory cell block 13, up to the word lines WL2, WL3, WL4, . . . of the NAND type memory cell block 14. At the time of providing access to the NOR type memory cell block 13, the word line WL1 and the block select lines WSL11 and WSL12 are caused to be at level necessary for access by the row address signal and the enable signal EN1 inputted to the row decoder 23. At the time of providing access to the NAND type memory cell block 14, the word lines WL2, WL3, . . . and the block select lines WSL21 and WSL22 are caused to be at level necessary for access by the row address signal and the enable signal EN2 inputted to the row decoder 23.

The devices according to the first and second embodiments comprise one NOR type memory cell block 1 13 and plural (M number of) NAND type memory cell blocks 2 14, 3 15, . . . , M+1 17.

On the contrary, the device according to the third embodiment of this invention comprises, as shown in FIG. 6, J (J is integer equal to 2 or more) number of NOR type memory cell blocks 1 31, 2 32, . . . , J, and M number of NAND type memory cell blocks J+1 34, J+2 35, . . . , M+J 36. Also in this case, similarly to the first embodiment, the bit lines BL1~BLN are of a structure in which they are shared with respect to the NOR type memory cell block and the NAND type memory cell block. In the case where addresses of the word lines WL are discontinuous with respect to word lines of NOR type memory cell blocks 1 31, . . . , J 33 and word lines of NAND type memory cell blocks J+1 34, . . . , M+1 36, those word lines are provided similarly to the first embodiment in a manner separated with respect to the row decoder for NOR type memory cell block and the row decoder for NAND type memory cell block. On the other hand, in the case where addresses of the word lines WL are continuous with respect to word lines of the NOR type memory cell blocks 1 31, . . . , J 33 and word lines of the NAND type memory cell blocks J+1 34, . . . , M+J 36, the row decoder for NOR type memory cell block and the row decoder for NAND type memory cell block are integrally provided similarly to the second embodiment.

The above-described embodiments are presented only for illustrative purpose, and do not limit this invention in any sense. While, in the above-mentioned embodiments, e.g., one or plural NOR type memory cell blocks and plural NAND type memory cell blocks are provided, this invention is not limited to such an implementation, but is only required to have at least one NOR type memory cell block and one NAND type memory cell block. Further, while, in the above-described embodiments, the NOR type memory cell block is provided in a manner close to the sense amplifier & write circuit, the NAND type memory cell block may be disposed at the position close to the sense amplifier & write circuit. In addition, the device according to this invention caused to be of one chip structure is not only limitatively used as the card type memory, but also may be used as a general memory device for storing the data body and the attribute data.

What is claimed is:

1. A semiconductor non-volatile memory device comprising:

a column decoder supplied with a column address signal to select a bit line;

a row decoder supplied with a row address signal to select a word line;

at least one NOR type memory cell block; and at least one NAND type memory cell block, wherein the NOR type memory cell block and the NAND type memory cell block are connected to common bit lines, and are connected to different word lines.

2. A semiconductor non-volatile memory device as set forth in claim 1, wherein when data is inputted to the NOR type memory cell block connected to the word line selected by the row decoder, or data which has been read out from the NOR type memory cell block is outputted, and when data is inputted to the NAND type memory cell block connected to the word line selected by the row decoder, or data which has been read from the NAND type memory cell block is outputted, data is transferred through corresponding one of the common bit lines.

3. A semiconductor non-volatile memory device as set forth in claim 1, which further comprises a sense amplifier and write circuit for amplifying data transferred through the bit line selected by the column decoder to output the data to the exterior, or to transfer data given from the external to the bit line selected by the column decoder, wherein when data is written into the NOR type memory cell block, or data written in the NOR type memory cell block is read out, and when data is written into the NAND type memory cell block, or data written in the NAND type memory cell block is read out, data is given from the exterior to the sense amplifier and write circuit through corresponding one of the common bit lines, or data is outputted from the sense amplifier and write circuit to the exterior through the corresponding one of the common bit lines.

4. A semiconductor non-volatile memory device as set forth in claim 1, wherein addresses of the word lines are continuous between the word lines connected to the NOR type memory cell block and the word lines connected to the NAND type memory cell block, and wherein the row decoder is adapted so that a row decoder for the NOR type memory cell block for selecting one of the word lines connected to the NOR type memory cell block and a row decoder for the NAND type memory cell block for selecting one of the word lines connected to the NAND type memory cell block are integrated.

5. A semiconductor non-volatile memory device as set forth in claim 1, wherein addresses of the word lines are discontinuous between the word lines connected to the NOR type memory cell block and the word lines connected to the NAND type memory cell block, and wherein the row decoder has a configuration separated with respect to a row decoder for NOR type memory cell block for selecting one of the word lines connected to the NOR type memory cell block and a row decoder for the NAND type memory cell block for selecting one of the word lines connected to the NAND type memory cell block.

6. A semiconductor non-volatile memory device as set forth in claim 1, wherein the NOR type memory cell block includes NOR type memory cell block select lines and a NOR type memory cell block word line or lines wired in a manner respectively perpendicular to the bit lines and N number of NOR type memory cell block select transistors and NOR type memory cell transistors arranged respectively in correspondence with the N number of bit lines, the NOR type memory cell block select transistors are caused to undergo ON/OFF control by the NOR type memory cell block select lines, the NOR type memory cell transistors are respectively connected to corresponding ones of the bit lines through corresponding ones of the NOR type memory cell block select transistors, and the NOR type memory cell transistors are caused to undergo ON/OFF control by the NOR type memory cell block word line or lines; and the NAND type memory cell block includes NAND type memory cell block select lines and M (M is integer equal to 2 or more) number of NAND type memory cell block word lines wired in a manner respectively perpendicular to the bit lines, N number of NAND type memory cell block select transistors disposed respectively in correspondence with the N number of bit lines, and M×N number of NAND type memory cell transistors respectively connected in series by M number of transistors along the bit line direction, the NAND type memory cell block select transistors are caused to undergo ON/OFF control by the NAND type memory cell block select lines, respective M sets of the NAND type memory cell transistors along the bit line direction are connected to corresponding ones of the bit lines through corresponding ones of the NAND type memory cell block transistors, and respective N sets of the NAND type memory cell transistors perpendicular to the bit lines are caused to undergo ON/OFF control by corresponding ones of the NAND type memory cell block word lines.

7. A semiconductor non-volatile memory device as set forth in claim 1, wherein the NOR type memory cell block comprises:

a first block select line, a NOR type memory cell block word line, and a second block select line respectively wired in a direction perpendicular to the bit lines, and includes, every respective ones of the bit lines, first block select transistors respectively having gates connected to the first block select line and one ends connected to the bit lines.

NOR type memory cell transistors respectively having one ends connected to the other ends of the first block select transistors and gates connected to the NOR type memory cell block word line, and second block select transistors respectively having one ends connected to the other ends of the NOR type memory cell transistors, the other ends grounded and gates connected to the second block select line, and wherein the NAND type memory cell block comprises a third block select line and M number of NAND type memory cell block word lines, and a fourth block select line respectively wired in a direction perpendicular to the bit lines, and includes, every respective ones of the bit lines, third block select transistors respectively having gates connected to the third block select line and one ends connected to the bit lines.

M number of NAND type memory cell transistors respectively having both ends connected in series between the other ends of the third block select transistors and one ends of fourth block select transistors, and gates connected to ones of the NAND type memory cell block word lines, and the fourth block transistors respectively having the one ends connected to one ends of the NAND type memory cell transistors of the final row of the NAND type memory cell transistors, the other ends grounded, and gates connected to the fourth block select line.

8. A semiconductor non-volatile memory device as set forth in claim 7, wherein the NOR type memory cell block is operative at the time of write operation to make a setting such that the first block select line is at high level and the second block select line is at low level to raise potential on the NOR type memory cell block word line to write data by the sense amplifier and write circuit into the NOR type memory cell transistor through the bit line selected by the column decoder, and operative at the time of read operation to make a setting such that the first and second block select lines are at high level to raise potential on the NOR type memory cell block word line to read out data by the sense amplifier and write circuit from the NOR type memory cell transistor through the bit line selected by the column decoder, and wherein the NAND type cell block is operative at the time of write operation to make a setting such that the first block select line is at high level and the second block select line is at low level, and to make a setting such that selected one of the NAND type memory cell block word lines is at a first potential higher than low level and the others thereof are at a second potential to serially write data into the NAND type memory cell transistor by the sense amplifier and write circuit through the bit lines successively selected by the column decoder, and operative at the time of read operation to make a setting such that the first and second block select lines are at high level, and to make a setting such that selected one of the NAND type memory cell block word lines is at low level and the others thereof are at high level to serially read out data by the sense amplifier and write circuit from the NAND type memory cell transistor through the bit lines selected in order by the column decoder.

9. A semiconductor non-volatile memory device as set forth in claim 7.

wherein the NOR type memory cell block is operative at the time of write operation to make a setting such that the first block select line is at high level and the second block select line is at low level to raise potential on the NOR type memory cell block word line to write data into the NOR type memory cell transistor by the sense amplifier and write circuit through the bit line selected by the column decoder, and operative at the time of read operation to make a setting such that the first and second block select lines are at low level to raise potential on the NOR type memory cell block word line to read out data by the sense amplifier and write circuit from the NOR type memory cell transistor through the bit line selected by the column decoder, and wherein the NAND type cell block is operative at the time of write operation to make a setting such that the first block select line is at high level and the second block select line is at low level, and to make a setting such that selected one of the NAND type memory cell block word lines is at a first potential higher than low level and the others thereof are at a second potential to serially write data by the sense amplifier and write circuit into the NAND type memory cell transistor through the bit lines selected in order by the column decoder, and operative at the time of read operation to make a setting such that the first and second block select lines are at high level, and to make a setting such that selected one of the NAND type memory cell block word lines is at low level and the others thereof are at high level to serially read out data by the sense amplifier and write circuit from the NAND type memory cell transistor through the bit lines selected in order by the column decoder.

* * * * *